(12) United States Patent
Kokame et al.

(10) Patent No.: US 12,501,819 B2
(45) Date of Patent: *Dec. 16, 2025

(54) METHOD OF MANUFACTURING DISPLAY DEVICE

(71) Applicant: Magnolia White Corporation, Tokyo (JP)

(72) Inventors: Hiraaki Kokame, Tokyo (JP); Toshifumi Mimura, Tokyo (JP); Kaichi Fukuda, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 437 days.

This patent is subject to a terminal disclaimer.

(21) Appl. No.: 18/151,486

(22) Filed: Jan. 9, 2023

(65) Prior Publication Data

US 2023/0225180 A1 Jul. 13, 2023

(30) Foreign Application Priority Data

Jan. 13, 2022 (JP) .................................. 2022-003736

(51) Int. Cl.
*H10K 71/20* (2023.01)
*H10K 59/12* (2023.01)
*H10K 102/00* (2023.01)

(52) U.S. Cl.
CPC ....... *H10K 71/231* (2023.02); *H10K 59/1201* (2023.02); *H10K 2102/351* (2023.02)

(58) Field of Classification Search
CPC ............. H10K 71/231; H10K 59/1201; H10K 2102/351; H10K 59/122

See application file for complete search history.

(56) References Cited

U.S. PATENT DOCUMENTS

| | | |
|---|---|---|
| 5,407,530 A | 4/1995 | Watanabe et al. |
| 2004/0160170 A1 | 8/2004 | Sato et al. |
| 2009/0009069 A1 | 1/2009 | Takata |

(Continued)

FOREIGN PATENT DOCUMENTS

| | | |
|---|---|---|
| JP | 6-215329 A | 8/1994 |
| JP | 2000-195677 A | 7/2000 |

(Continued)

OTHER PUBLICATIONS

Indian Office Action issued Jul. 2, 2024, in corresponding Indian Patent Application No. 202314001825, 7pp.

*Primary Examiner* — J. E. Schoenholtz
(74) *Attorney, Agent, or Firm* — XSENSUS LLP (57) ABSTRACT

According to one embodiment, a method of manufacturing a display device includes preparing a processing substrate with a lower electrode, a rib, and a partition including a lower portion and an upper portion, forming a first organic layer and a second organic layer spaced apart from the first organic layer, forming a first upper electrode and a second upper electrode spaced apart from the first upper electrode, forming a sealing layer located on the first upper electrode and the second upper electrode, forming a resist covering a part of the sealing layer, performing anisotropic dry etching using the resist as a mask, performing isotropic dry etching using the resist as a mask, and removing the sealing layer exposed from the resist.

11 Claims, 11 Drawing Sheets

(56) References Cited

U.S. PATENT DOCUMENTS

| | | | | |
|---|---|---|---|---|
| 2011/0180821 A1* | 7/2011 | Matsushima | ........ | H10K 59/122 |
| | | | | 438/34 |
| 2015/0060822 A1* | 3/2015 | Kamiya | ............... | H10K 59/873 |
| | | | | 257/40 |
| 2018/0130972 A1 | 5/2018 | Sonoda et al. | | |
| 2019/0363275 A1 | 11/2019 | Ochi et al. | | |
| 2023/0240126 A1* | 7/2023 | Mimura | ............... | H10K 59/122 |
| | | | | 438/99 |

FOREIGN PATENT DOCUMENTS

| | | |
|---|---|---|
| JP | 2003-7460 A | 1/2003 |
| JP | 2004-207217 A | 7/2004 |
| JP | 2008-135325 A | 6/2008 |
| JP | 2009-32673 A | 2/2009 |
| JP | 2010-118191 A | 5/2010 |
| JP | 2014-149994 A | 8/2014 |
| WO | 2018/179308 A1 | 10/2018 |

* cited by examiner

METHOD OF MANUFACTURING DISPLAY DEVICE

CROSS-REFERENCE TO RELATED APPLICATIONS

This application is based upon and claims the benefit of priority from Japanese Patent Application No. 2022-003736, filed Jan. 13, 2022, the entire contents of which are incorporated herein by reference.

FIELD

Embodiments described herein relate generally to a method of manufacturing a display device.

BACKGROUND

Recently, display devices applying organic light-emitting diodes (OLEDs) as display elements have been put to practical use. This display element comprises a pixel circuit including a thin-film transistor, a lower electrode connected to the pixel circuit, an organic layer covering the lower electrode, and an upper electrode covering the organic layer. The organic layer includes functional layers such as a hole-transport layer and an electron-transport layer, in addition to a light-emitting layer.

Such a display element is easily degraded by moisture. Therefore, there is a need for a technology to reliably seal the display element.

DETAILED DESCRIPTION

In general, according to one embodiment, a method of manufacturing a display device, comprises: preparing a processing substrate in which a lower electrode, a rib having an aperture overlapping the lower electrode, and a partition including a lower portion disposed on the rib and an upper portion disposed on the lower portion and protruding from a side surface of the lower portion are formed above a substrate; forming a first organic layer covering the lower electrode and a second organic layer spaced apart from the first organic layer and located on the upper portion; forming a first upper electrode covering the first organic layer and in contact with the lower portion, and a second upper electrode spaced apart from the first upper electrode and located on the second organic layer; forming a sealing layer located on the first upper electrode and the second upper electrode; forming a resist covering a part of the sealing layer; performing anisotropic dry etching using the resist as a mask to reduce thickness of the sealing layer exposed from the resist; and performing isotropic dry etching using the resist as a mask to remove the sealing layer exposed from the resist.

Embodiments will be described hereinafter with reference to the accompanying drawings.

The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

Note that, in order to make the descriptions more easily understandable, some of the drawings illustrate an X axis, a Y axis and a Z axis orthogonal to each other. A direction along the X axis is referred to as a first direction, a direction along the Y axis is referred to as a second direction and direction along the Z axis is referred to as a third direction. Viewing an element in an X-Y plane defined by the X-axis and the Y-axis is referred to as plan view.

The display device according to the present embodiment is an organic electroluminescent display device comprising an organic light-emitting diode (OLED) as a display element, and can be installed in TVs, personal computers, in-vehicle equipment, tablet terminals, smartphones, mobile phone terminals, and the like.

Figure 1:
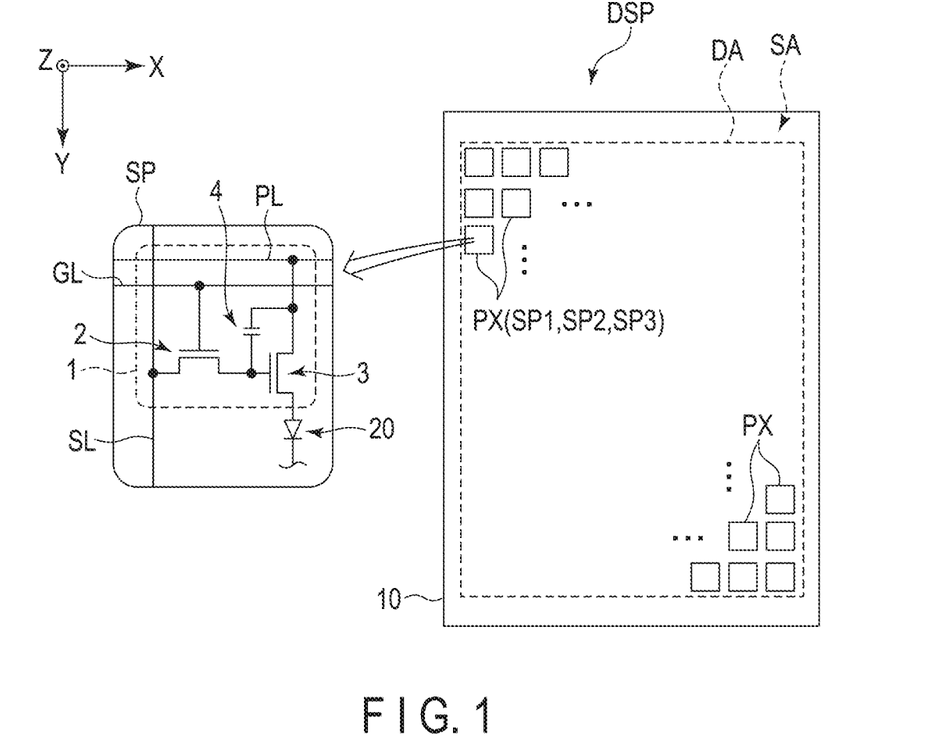
FIG. 1 shows a configuration example of a display device DSP.

FIG. 1 shows a configuration example of a display device DSP.

The display device DSP includes a display area DA on which images are displayed and a peripheral area SA around the display area DA on an insulating substrate 10. The substrate 10 may be glass or a flexible resin film.

In the present embodiment, the shape of the substrate 10 in plan view is rectangular. However, the shape of the substrate 10 in plan view is not limited to a rectangle, but may be other shapes such as a square, circle, or oval.

The display area DA comprises a plurality of pixels PX arranged in a matrix in a first direction X and a second direction Y. The pixel PX includes a plurality of sub-pixels SP. In one example, the pixel PX includes a red sub-pixel SP1, a green sub-pixel SP2, and a blue sub-pixel SP3. Note that the pixel PX may include sub-pixels SP of other colors such as white together with sub-pixels SP1, SP2, and SP3, or in place of any of the sub-pixels SP1, SP2, and SP3.

The sub-pixel SP comprises a pixel circuit 1 and a display element 20 driven by the pixel circuit 1. The pixel circuit 1 comprises a pixel switch 2, a drive transistor 3, and a capacitor 4. The pixel switch 2 and the drive transistor 3 are switching elements configured by a thin-film transistors, for example.

A gate electrode of the pixel switch 2 is connected to a scanning line GL. One of a source electrode and a drain electrode of the pixel switch 2 is connected to a signal line SL, and the other is connected to a gate electrode of the drive transistor 3 and the capacitor 4. In the drive transistor 3, one of a source electrode and a drain electrode is connected to a power line PL and the capacitor 4, and the other is connected to an anode of the display element 20.

Note that, the configuration of the pixel circuit 1 is not limited to the illustrated example. For example, the pixel circuit 1 may comprise more thin-film transistors and capacitors.

The display element 20 is an organic light-emitting diode (OLED) as a light-emitting element, which, in some cases, are referred to as an organic EL element. For example, the sub-pixel SP1 comprises a display element 20 that emits light in a red wavelength range, the sub-pixel SP2 comprises a display element 20 that emits light in a green wavelength range, and the sub-pixel SP3 comprises a display element 20 that emits light in a blue wavelength range.

Figure 2:
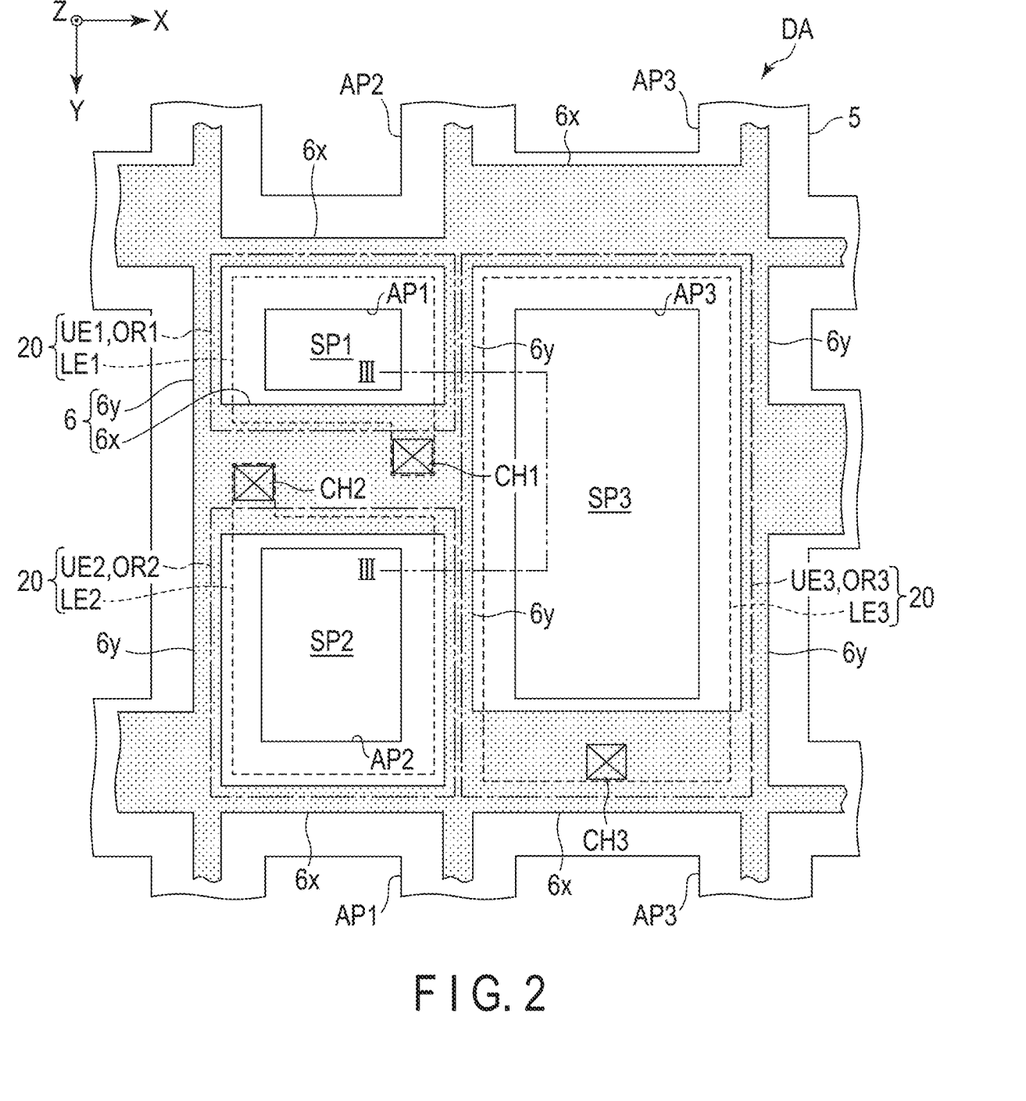
FIG. 2 shows an example of a layout of sub-pixels SP1, SP2, and SP3.

FIG. 2 shows an example of a layout of the sub-pixels SP1, SP2, and SP3.

In the example in FIG. 2, the sub-pixel SP1 and the sub-pixel SP2 are arranged in the second direction Y. Furthermore, the sub-pixels SP1 and SP2 are respectively arranged with the sub-pixel SP3 in the first direction X.

In the case where the sub-pixels SP1, SP2, and SP3 are in such a layout, a column in which the sub-pixels SP1 and SP2 are alternately arranged in the second direction Y, and a column in which a plurality of sub-pixels SP3 are arranged in the second direction Y are formed in the display area DA. These columns are alternately arranged in the first direction X.

Note that the layout of the sub-pixels SP1, SP2, and SP3 is not limited to the example in FIG. 2. As another example, the sub-pixels SP1, SP2, and SP3 in each pixel PX may be arranged in order in the first direction X.

A rib 5 and a partition 6 are arranged in the display area DA. The rib 5 has apertures AP1, AP2, and AP3 in the sub-pixels SP1, SP2, and SP3, respectively. In the example shown in FIG. 2, the aperture AP2 is larger than the aperture AP1, and the aperture AP3 is larger than the aperture AP2.

The partition 6 overlaps the rib 5 in plan view. The partition 6 has a plurality of first partitions 6x extending in the first direction X and a plurality of second partitions 6y extending in the second direction Y. A plurality of first partitions 6x are disposed between adjacent apertures AP1 and AP2 in the second direction Y, and between two adjacent apertures AP3 in the second direction Y, respectively. A plurality of second partitions 6y are disposed between adjacent apertures AP1 and AP3 in the first direction X, and between adjacent apertures AP2 and AP3 in the first direction X, respectively.

In the example of FIG. 2, the first partition 6x and the second partition 6y are connected to each other. As a result, the partition 6 as a whole is formed into a lattice shape surrounding the apertures AP1, AP2, and AP3. The partition 6 can be considered as having apertures in the sub-pixels SP1, SP2 and SP3 in the same manner as the rib 5.

The sub-pixel SP1 comprises a lower electrode LE1, an upper electrode UE1, and an organic layer OR1 that overlap with the aperture AP1, respectively. The sub-pixel SP2 comprises a lower electrode LE2, an upper electrode UE2, and an organic layer OR2 that overlap with the aperture AP2, respectively. The sub-pixel SP3 comprises a lower electrode LE3, an upper electrode UE3, and an organic layer OR3 that overlap with the aperture AP3, respectively.

In the example in FIG. 2, the outer shape of the lower electrodes LE1, LE2, and LE3 are shown as dotted lines, and the outer shapes of the organic layers OR1, OR2, and OR3 and the upper electrodes UE1, UE2, and UE3 are shown as chain lines. Each peripheral edge of the lower electrodes LE1, LE2, and LE3 overlaps the rib 5. The outer shape of the upper electrode UE1 substantially matches the outer shape of the organic layer OR1, and each peripheral edge of the upper electrode UE1 and the organic layer OR1 overlaps the partition 6. The outer shape of the upper electrode UE2 substantially matches the outer shape of the organic layer OR2, and each peripheral edge of the upper electrode UE2 and the organic layer OR2 overlaps the partition 6. The outer shape of the upper electrode UE3 substantially matches the outer shape of the organic layer OR3, and each peripheral edge of the upper electrode UE3 and the organic layer OR3 overlaps the partition 6.

The lower electrode LE1, the upper electrode UE1, and the organic layer OR1 configure the display element 20 of the sub-pixel SP1. The lower electrode LE2, the upper electrode UE2, and the organic layer OR2 configure the display element 20 of the sub-pixel SP2. The lower electrode LE3, the upper electrode UE3, and the organic layer OR3 configure the display element 20 of the sub-pixel SP3. The lower electrodes LE1, LE2, and LE3, for example, correspond to the anodes of the display element 20. The upper electrodes UE1, UE2, and UE3 correspond to the cathodes of the display element 20 or common electrodes.

The lower electrode LE1 is connected to the pixel circuit 1 of the sub-pixel SP1 (see FIG. 1) through a contact hole CH1. The lower electrode LE2 is connected to the pixel circuit 1 of the sub-pixel SP2 through a contact hole CH2. The lower electrode LE3 is connected to the pixel circuit 1 of the sub-pixel SP3 through a contact hole CH3.

Figure 3:
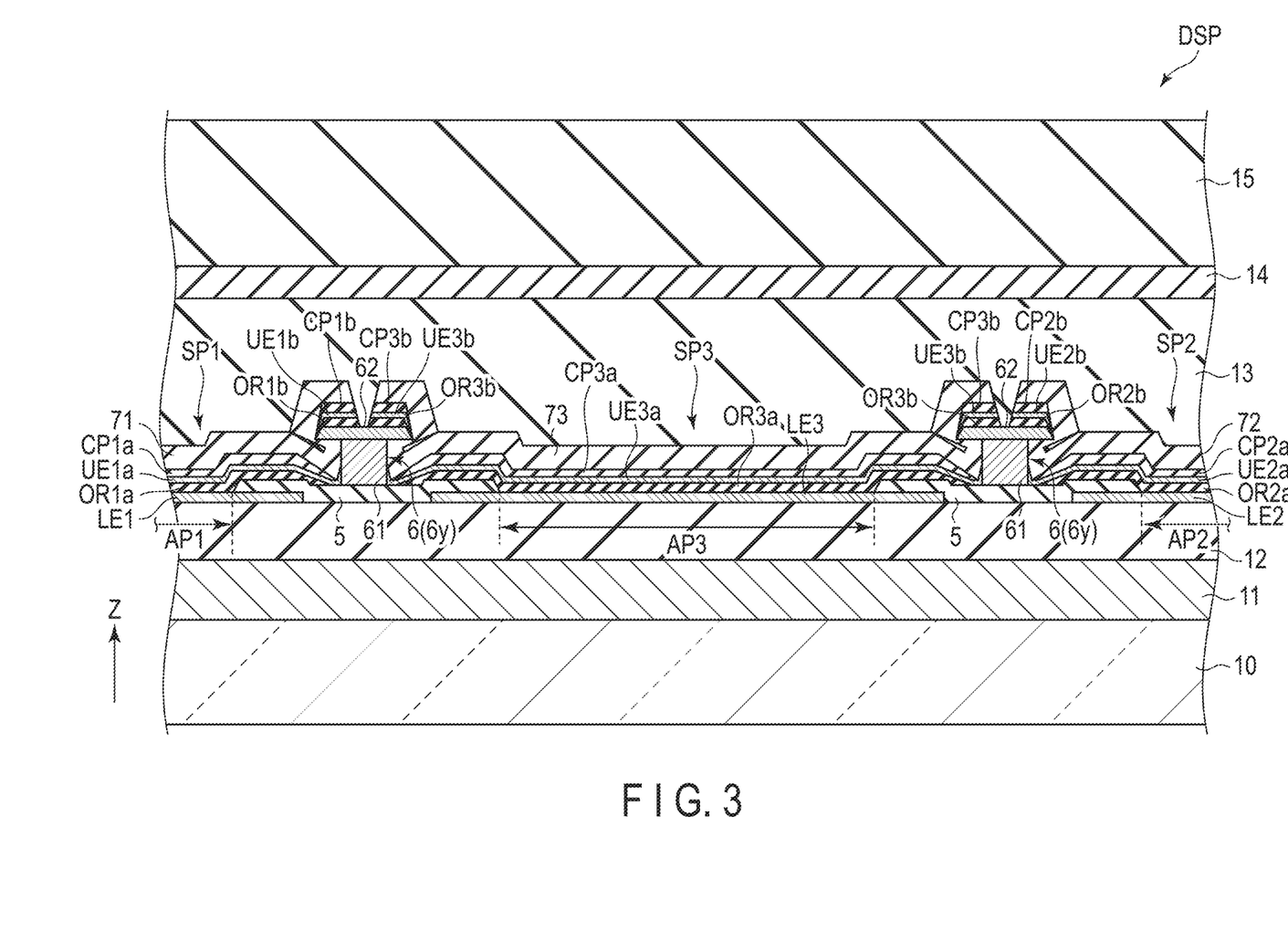
FIG. 3 is a schematic cross-sectional view of the display device DSP along a III-III line in FIG. 2.

FIG. 3 is a schematic cross-sectional view of the display device DSP along a III-III line in FIG. 2.

A circuit layer 11 is disposed on the substrate 10 described above. The circuit layer 11 includes various circuits such as the pixel circuit 1, and various lines such as the scanning line GL, the signal line SL, and the power line PL shown in FIG. 1.

The circuit layer 11 is covered by an insulating layer 12. The insulating layer 12 functions as a planarization film that planarizes unevenness caused by the circuit layer 11.

The lower electrodes LE1, LE2, and LE3 are disposed on the insulating layer 12. The rib 5 is disposed on the insulating layer 12 and the lower electrodes LE1, LE2, and LE3. The ends of the lower electrodes LE1, LE2, and LE3 are covered by the rib 5.

The partition 6 includes a lower portion 61 disposed on the rib 5 and an upper portion 62 covering the upper surface of the lower portion 61. The upper portion 62 has a greater width than the lower portion 61. As a result, in FIG. 3, both ends of the upper portion 62 protrude from the side surfaces of the lower portion 61. Such a shape of the partition 6 can also be referred to as an overhang shape.

The organic layer OR1 shown in FIG. 2 includes a first organic layer OR1a and a second organic layer OR1b spaced apart from each other. In addition, the upper electrode UE1 shown in FIG. 2 includes a first upper electrode UE1a and a second upper electrode UE1b spaced apart from each other. As shown in FIG. 3, the first organic layer OR1a is in contact with the lower electrode LE1 through the aperture AP1, covers the lower electrode LE1, and covers a part of the rib 5. The second organic layer OR1b is located on the upper portion 62. The first upper electrode UE1a faces the lower electrode LE1 and covers the first organic layer OR1a. Furthermore, the first upper electrode UE1a is in contact with the side surface of the lower portion 61. The second upper electrode UE1b is located above the partition 6 and covers the second organic layer OR1b.

The organic layer OR2 shown in FIG. 2 includes a first organic layer OR2a and a second organic layer OR2b spaced apart from each other. In addition, the upper electrode UE2 shown in FIG. 2 includes a first upper electrode UE2a and a second upper electrode UE2b spaced apart from each other. As shown in FIG. 3, the first organic layer OR2a is in contact with the lower electrode LE2 though the aperture AP2, covers the lower electrode LE2, and covers a part of the rib 5. The second organic layer OR2b is located on the upper portion 62. The first upper electrode UE2a faces the lower electrode LE2 and covers the first organic layer OR2a. Furthermore, the first upper electrode UE2a is in contact with the side surface of the lower portion 61. The second upper electrode UE2b is located above the partition 6 and covers the second organic layer OR2b.

The organic layer OR3 shown in FIG. 2 includes a first organic layer OR3a and a second organic layer OR3b spaced apart from each other. In addition, the upper electrode UE3 shown in FIG. 2 includes a first upper electrode UE3a and a second upper electrode UE3b spaced apart from each other. As shown in FIG. 3, the first organic layer OR3a is in contact with the lower electrode LE3 through the aperture AP3, covers the lower electrode LE3, and covers a part of the rib 5. The second organic layer OR3b is located on the upper portion 62. The first upper electrode UE3a faces the lower electrode LE3 and covers the first organic layer OR3a. Furthermore, the first upper electrode UE3a is in contact with the side surface of the lower portion 61. The second upper electrode UE3b is located above the partition 6 and covers the second organic layer OR3b.

In the example shown in FIG. 3, the sub-pixels SP1, SP2, and SP3 include cap layers CP1, CP2, and CP3 for adjusting optical properties of light emitted by light-emitting layers of the organic layers OR1, OR2, and OR3.

The cap layer CP1 includes a first cap layer CP1a and a second cap layer CP1b spaced apart from each other. The first cap layer CP1a is located in the aperture AP1 and disposed on the first upper electrode UE1a. The second cap layer CP1b is located above the partition 6 and is disposed on the second upper electrode UE1b.

The cap layer CP2 includes a first cap layer CP2a and a second cap layer CP2b spaced apart from each other. The first cap layer CP2a is located in the aperture AP2 and disposed on the first upper electrode UE2a. The second cap layer CP2b is located above the partition 6 and is disposed on the second upper electrode UE2b.

The cap layer CP3 includes a first cap layer CP3a and a second cap layer CP3b spaced apart from each other. The first cap layer CP3a is located in the aperture AP3 and located above the first upper electrode UE3a. The second cap layer CP3b is located above the partition 6 and is disposed on the second upper electrode UE3b.

In the sub-pixels SP1, SP2, and SP3, sealing layers 71, 72, and 73 are disposed, respectively. The sealing layer 71 continuously covers each member of the sub-pixel SP1 including the first cap layer CP1a, the partition 6, and the second cap layer CP1b. The sealing layer 72 continuously covers each member of the sub-pixel SP2 including the first cap layer CP2a, the partition 6, and the second cap layer CP2b. The sealing layer 73 continuously covers each member of the sub-pixel SP3 including the first cap layer CP3a, the partition 6, and the second cap layer CP3b.

In the example of FIG. 3, between the sub-pixels SP1 and SP3, the second organic layer OR1b, the second upper electrode UE1b, the second cap layer CP1b, and the sealing layer 71 on the partition 6, are spaced apart from the second organic layer OR3b, the second upper electrode UE3b, the second cap layer CP3b, and the sealing layer 73 on the partition 6. In addition, between the sub-pixels SP2 and SP3, the second organic layer OR2b, the second upper electrode UE2b, the second cap layer CP2b, and the sealing layer 72 on the partition 6, are spaced apart from the second organic layer OR3b, the second upper electrode UE3b, the second cap layer CP3b, and the sealing layer 73 on the partition 6.

The sealing layers 71, 72, and 73 are covered by a resin layer 13. The resin layer 13 is covered by a sealing layer 14. Furthermore, the sealing layer 14 is covered by a resin layer 15.

The insulating layer 12 is formed of an organic material. The rib 5 and the sealing layers 14, 71, 72, and 73 are formed of an inorganic material, such as silicon nitride (SiNx). The thickness of the rib 5, which is formed of an inorganic material, is sufficiently smaller than the thicknesses of the partition 6 and the insulating layer 12. In one example, the thickness of the rib 5 is 200 nm or more and 400 nm or less.

The lower portion 61 of the partition 6 is conductive. The upper portion 62 of the partition 6 may also be conductive.

The lower electrodes LE1, LE2, and LE3 may be formed of a transparent conductive material such as ITO, or may have a laminated structure of a metallic material such as silver (Ag) and a transparent conductive material. The upper electrodes UE1, UE2, and UE3 are formed of a metallic material such as an alloy of magnesium and silver (MgAg). The upper electrodes UE1, UE2, and UE3 may be formed of a transparent conductive material such as ITO.

In a case where the potentials of the lower electrodes LE1, LE2, and LE3 are relatively higher than the potentials of the upper electrodes UE1, UE2, and UE3, the lower electrodes LE1, LE2, and LE3 correspond to anodes, and the upper electrodes UE1, UE2, and UE3 correspond to cathodes. In addition, in a case where the potentials of the upper electrodes UE1, UE2, and UE3 are relatively higher than the potentials of the lower electrodes LE1, LE2, and LE3, the upper electrodes UE1, UE2, and UE3 correspond to anodes, and the lower electrodes LE1, LE2, and LE3 correspond to cathodes.

The organic layers OR1, OR2, and OR3 include a plurality of functional layers and a light-emitting layer.

The cap layers CP1, CP2, and CP3 are formed by, for example, a multi-layered body of transparent thin films. The multi-layered body may include, as thin films, a thin film formed by an inorganic material and a thin film formed by an organic material. These plurality of thin films have different refractive indices from each other. The materials of the thin films configuring the multi-layered body are different from the material of the upper electrodes UE1, UE2, and UE3 and are different from the material of the sealing layers 71, 72, and 73. Note that the cap layers CP1, CP2, and CP3 may be omitted.

A common voltage is supplied to the partition 6. This common voltage is supplied to each of the first upper electrodes UE1a, UE2a, and UE3a in contact with the side surface of the lower portion 61. A pixel voltage is supplied to the lower electrodes LE1, LE2, and LE3 through the pixel circuit 1 included in each of the sub-pixels SP1, SP2, and SP3.

When a potential difference is formed between the lower electrode LE1 and the upper electrode UE1, the light-emitting layer of the first organic layer OR1a emits light in a red wavelength range. When a potential difference is formed between the lower electrode LE2 and the upper electrode UE2, the light-emitting layer of the first organic layer OR2a emits light in a green wavelength range. When a potential difference is formed between the lower electrode LE3 and the upper electrode UE3, the light-emitting layer of the first organic layer OR3a emits light in a blue wavelength range.

As another example, the light-emitting layers of the organic layers OR1, OR2, and OR3 may emit light of the same color (e.g., white). In this case, the display device DSP may comprise a color filter that converts the light emitted by the light-emitting layers into light of a color corresponding to the sub-pixels SP1, SP2, and SP3. The display device DSP may also comprise a layer including quantum dots that are excited by the light emitted by the light-emitting layer and generate light of the color corresponding to the sub-pixels SP1, SP2, and SP3.

Figure 4:
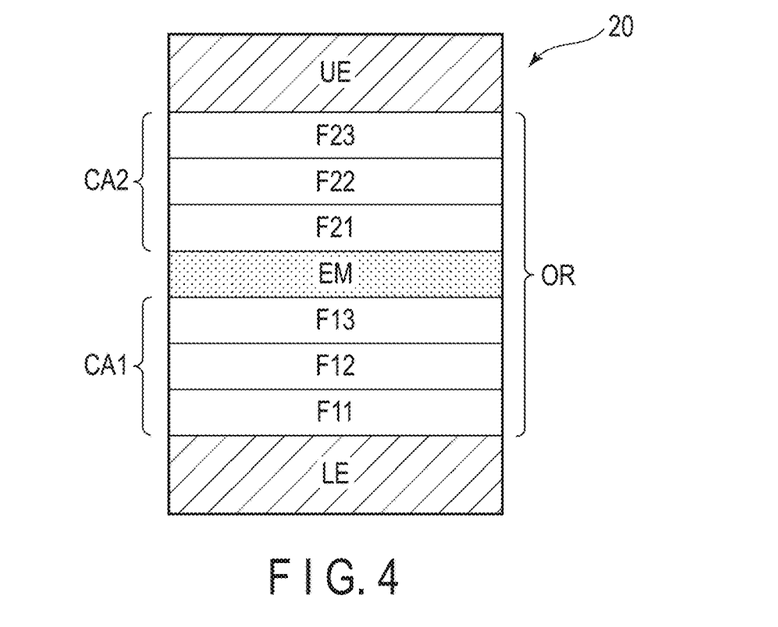
FIG. 4 shows an example of the configuration of a display element 20.

FIG. 4 shows an example of a configuration of the display device 20.

The lower electrode LE shown in FIG. 4 corresponds to each of the lower electrodes LE1, LE2, and LE3 shown in FIG. 3. The organic layer OR shown in FIG. 4 corresponds to each of the organic layers OR1, OR2, and OR3 shown in FIG. 3. The upper electrode UE shown in FIG. 4 corresponds to each of the upper electrodes UE1, UE2, and UE3 shown in FIG. 3.

The organic layer OR includes a carrier adjustment layer CA1, a light-emitting layer EM, and a carrier adjustment layer CA2. The carrier adjustment layer CA1 is located between the lower electrode LE and the light-emitting layer EM, and the carrier adjustment layer CA2 is located between the light-emitting layer EM and the upper electrode UE. The carrier adjustment layers CA1 and CA2 include multiple functional layers. The following describes an example in a case where the lower electrode LE corresponds to the anode, and the upper electrode UE corresponds to the cathode.

The carrier adjustment layer CA1 includes, as functional layers, a hole-injection layer F11, a hole-transport layer F12, and an electron blocking layer F13, etc. The hole-injection layer F11 is disposed on the lower electrode LE, the hole-transport layer F12 is disposed on the hole-injection layer F11, the electron blocking layer F13 is disposed on the hole-transport layer F12, and the light-emitting layer EM is disposed on the electron blocking layer F13.

The carrier adjustment layer CA2 includes, as functional layers, a hole blocking layer F21, an electron-transport layer F22, and an electron-injection layer F23, etc. The hole blocking layer F21 is disposed on the light-emitting layer EM, the electron-transport layer F22 is disposed on the hole blocking layer F21, the electron-injection layer F23 is disposed on the electron-transport layer F22, and the upper electrode UE is disposed on the electron-injection layer F23.

Note that, the carrier adjustment layers CA1 and CA2 may include other functional layers such as carrier generation layers as needed in addition to the functional layers described above, or may omit at least one of the above functional layers.

Next, an example of a manufacturing method of the display device DSP will be described with reference to FIG. 5 to FIG. 12.

Figure 5:
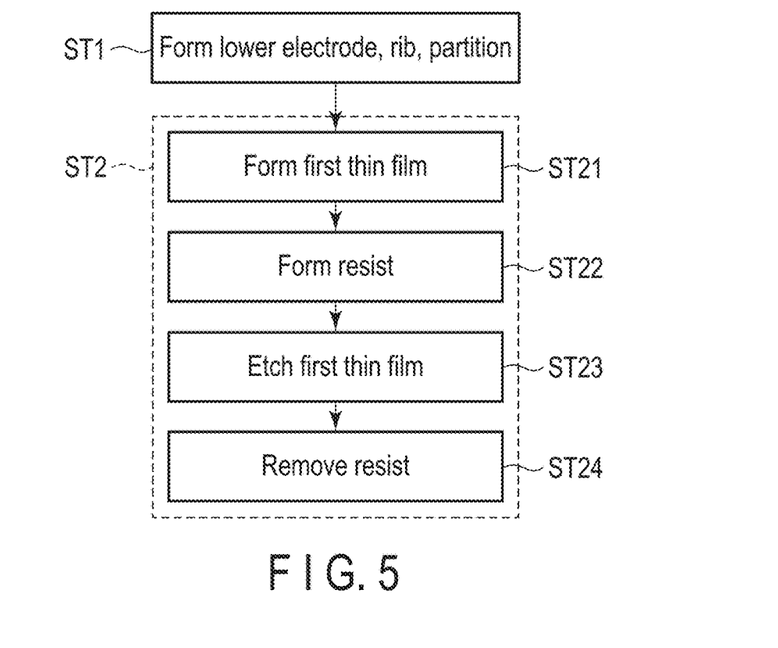
FIG. 5 is a flow diagram illustrating an example of a method of manufacturing the display device DSP.

FIG. 5 is a flow diagram illustrating an example of the manufacturing method of the display device DSP.

The manufacturing method shown here can be roughly divided into a process of preparing a processing substrate SUB that serves as a base for sub-pixels (step ST1) and a process of forming sub-pixels SPα (step ST2). After step ST2, a process of forming sub-pixels SPβ similar to the process of forming sub-pixels SPα is performed, and a process of forming sub-pixels SPγ is further performed. Note that the sub-pixels SPα, SPβ, and SPγ here are one of the sub-pixels SP1, SP2, and SP3 described above.

In step ST2, first, a first thin film is formed on the processing substrate SUB (step ST21). Then, a resist patterned in a predetermined shape is formed on the first thin film (step ST22). The first thin film is then etched using the resist as a mask (step ST23). The resist is then removed (step ST24). As a result, a sub-pixel SPα with a first thin film of a predetermined shape is formed. The process of forming the sub-pixel SPβ and the process of forming the sub-pixel SPγ include the same processes as in step ST21 to step ST24.

Step ST1 and step ST2 are described specifically below.

Figure 6:
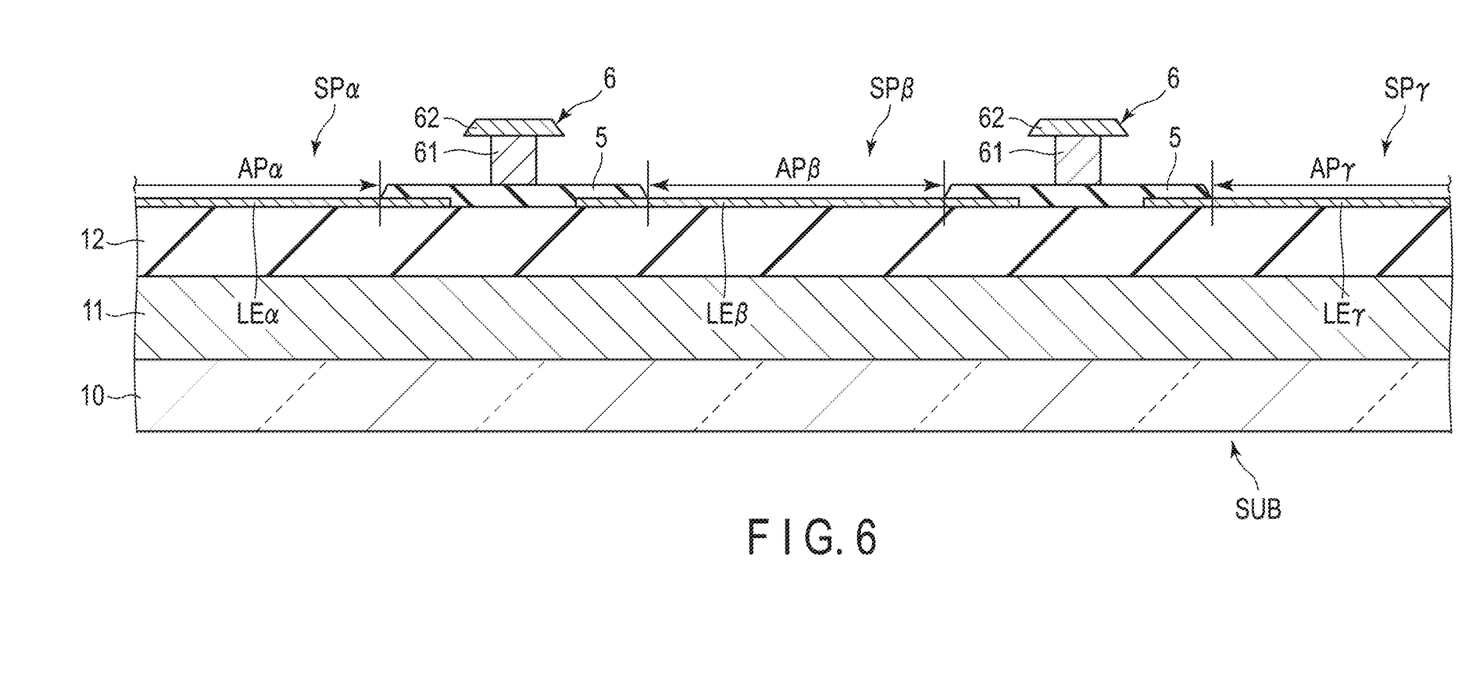
FIG. 6 illustrates a process of preparing a processing substrate.

First, in step ST1, as shown in FIG. 6, the processing substrate SUB, in which, lower electrodes LEα, LEβ, and LEγ, the rib 5 including apertures APα, APβ, and APγ overlapping each of the lower electrodes LEα, LEβ, and LEγ, and the partition 6 including the lower portion 61 disposed on the rib 5 and the upper portion 62 disposed on the lower portion 61 and protruding from the side surface of the lower portion 61 is formed above the substrate 10, is prepared. Note that, in FIG. 7 to FIG. 12, the substrate 10 and the circuit layer 11 in layers lower than the insulating layer 12 are omitted.

Figure 7:
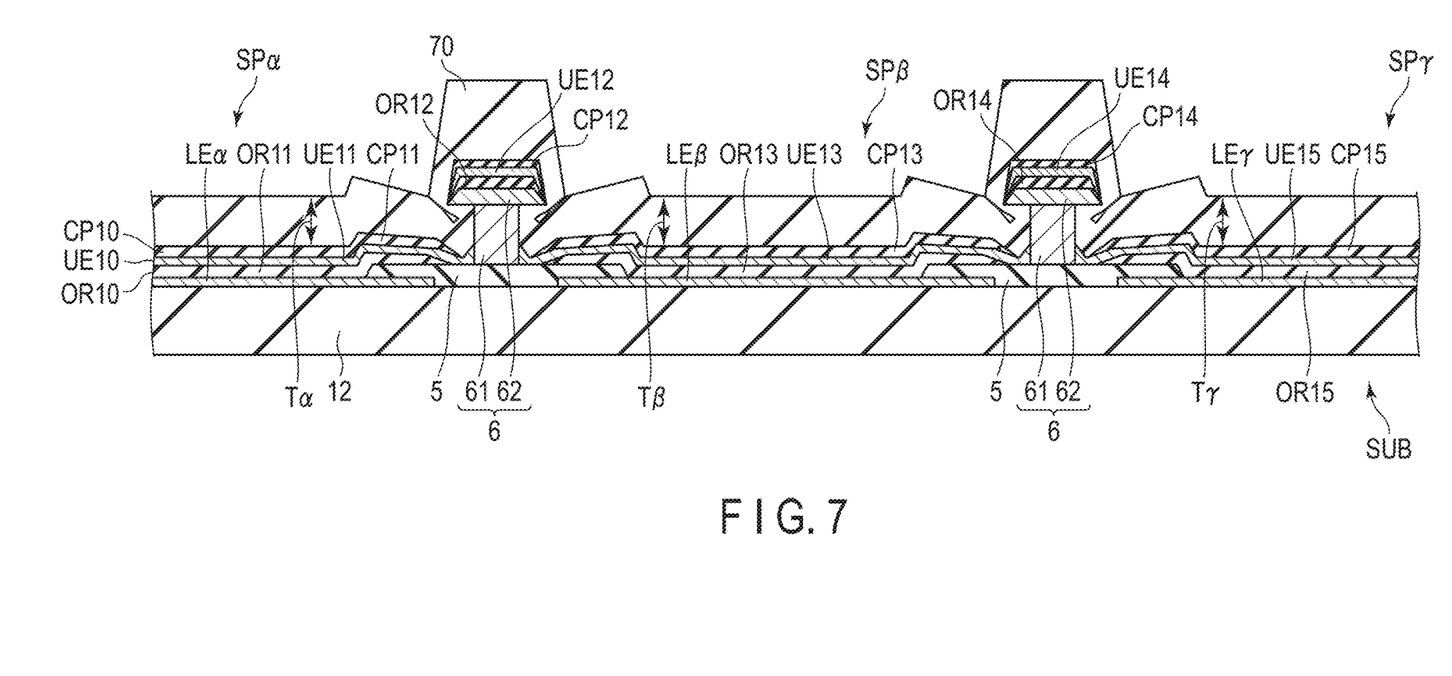
FIG. 7 illustrates a process of forming a first thin film.

Then, in step ST21, as shown in FIG. 7, after forming an organic layer OR10 on the processing substrate SUB, an upper electrode UE10 is formed on the organic layer OR10, a cap layer CP10 is formed on the upper electrode UE10, and a sealing layer 70 is formed on the cap layer CP10. In other words, in the example shown in FIG. 7, the organic layer OR10, the upper electrode UE10, the cap layer CP10, and the sealing layer 70 are included as the first thin film.

The organic layer OR10 includes a first organic layer OR11, a second organic layer OR12, a third organic layer OR13, a fourth organic layer OR14, and a fifth organic layer OR15. The first organic layer OR11, the second organic layer OR12, the third organic layer OR13, the fourth organic layer OR14, and the fifth organic layer OR15 includes a first light-emitting layer that emits light of a first color.

The first organic layer OR11 is formed to cover the lower electrode LEα. The second organic layer OR12 is spaced apart from the first organic layer OR11 and is located on the upper portion 62 of the partition 6 between the lower electrode LEα and the lower electrode LEβ. The third organic layer OR13 is space apart from the second organic layer OR12 and is formed to cover the lower electrode LEβ. The fourth organic layer OR14 is spaced apart from the third organic layer OR13 and is located on the upper portion 62 of the partition 6 between the lower electrode LEβ and the lower electrode LEγ. The fifth organic layer OR15 is spaced apart from the fourth organic layer OR14 and is formed to cover the lower electrode LEγ.

The upper electrode UE10 includes a first upper electrode UE11, a second upper electrode UE12, a third upper electrode UE13, a fourth upper electrode UE14, and a fifth upper electrode UE15.

The first upper electrode UE11 covers the first organic layer OR11 and is in contact with the lower portion 61 of the partition 6 between the lower electrode LEα and the lower electrode LEβ. The second upper electrode UE12 is spaced apart from the first upper electrode UE11 and is located on the second organic layer OR12 between the lower electrode LEα and the lower electrode LEβ. The third upper electrode UE13 is spaced apart from the second upper electrode UE12 and covers the third organic layer OR13. In the illustrated example, the third upper electrode UE13 is in contact with the lower portion 61 of the partition 6 between the lower electrode LEα and the lower electrode LEβ and is in contact with the lower portion 61 of the partition 6 between the lower electrode LEβ and the lower electrode LEγ, but may be in contact with one of the lower portions 61. The fourth upper electrode UE14 is spaced apart from the third upper electrode UE13 and is located on the fourth organic layer OR14 between the lower electrode LEβ and the lower electrode LEγ. The fifth upper electrode UE15 is spaced apart from the fourth upper electrode UE14, covers the fifth organic layer OR15, and is in contact with the lower portion 61 of the partition 6 between the lower electrode LEβ and the lower electrode LEγ.

The cap layer CP10 includes a first cap layer CP11, a second cap layer CP12, a third cap layer CP13, a fourth cap layer CP14, and a fifth cap layer CP15.

The first cap layer CP11 is located on the first upper electrode UE11. The second cap layer CP12 is spaced apart from the first cap layer CP11 and is located on the second upper electrode UE12. The third cap layer CP13 is spaced apart from the second cap layer CP12 and is located on the third upper electrode UE13. The fourth cap layer CP14 is spaced apart from the third cap layer CP13 and is located on the fourth upper electrode UE14. The fifth cap layer CP15 is spaced apart from the fourth cap layer CP14 and is located on the fifth upper electrode UE15.

The sealing layer 70 is formed by an inorganic material. The sealing layer 70 is formed to cover the first cap layer CP11, the second cap layer CP12, the third cap layer CP13, the fourth cap layer CP14, the fifth cap layer CP15, and the partition 6. The sealing layer 70 has a thickness Tα in the sub-pixel SPα, a thickness Tβ, in the sub-pixel SPβ, and a thickness Tγ in the sub-pixel SPγ. Here, the thicknesses Tα, Tβ, and Tγ are almost equivalent.

Figure 8:
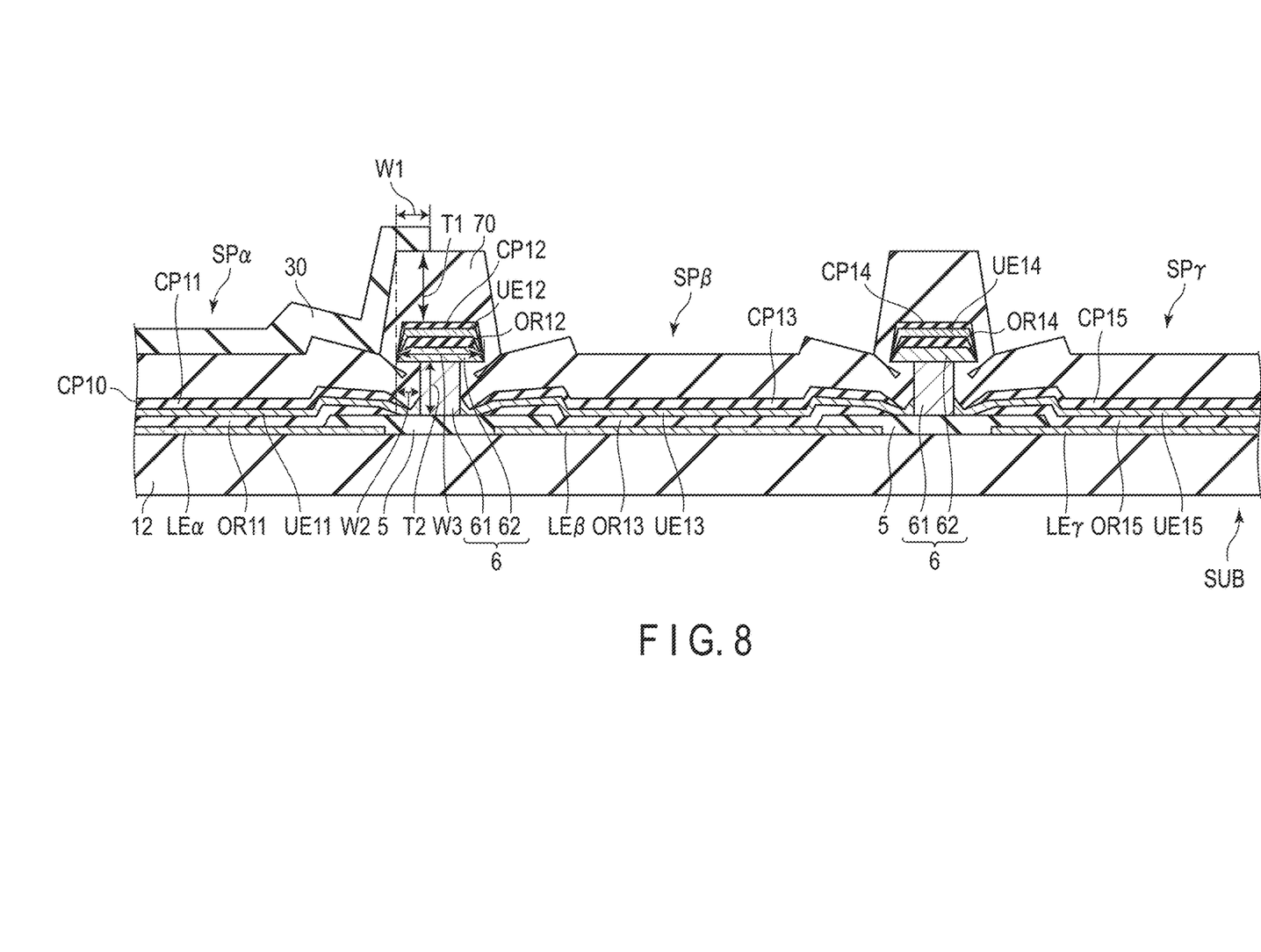
FIG. 8 illustrates a process of forming a resist.

Then, in step ST22, as shown in FIG. 8, a resist is applied on the sealing layer 70, and this resist is patterned. A patterned resist 30 covers the sub-pixel SPα. That is, the resist 30 is disposed directly above the lower electrode LEα, the first organic layer OR11, the first upper electrode UE11, and the first cap layer CP11. The resist 30 also extends from the sub-pixel SPα to above the partition 6. Between the sub-pixel SPα and the sub-pixel SPβ, the resist 30 is disposed on the sub-pixel SPα side (left side in the drawing) and exposes the sealing layer 70 on the sub-pixel SPβ side (right side in the drawing). In the illustrated example, the resist 30 exposes the sealing layer 70 in the sub-pixel SPβ and the sub-pixel SPγ.

A thickness T1 of the sealing layer 70 between the upper portion 62 of the partition 6 and the resist 30 is greater than a thickness T2 of the lower portion 61.

A width W1 of the resist 30 directly above the upper portion 62 is greater than a width W2 of the upper portion 62 protruding from the side surface of the lower portion 61 and smaller than a total width W3 of the upper portion 62. In one example, the width W1 of the resist 30 is equal to or greater than 1 μm.

Figure 9:
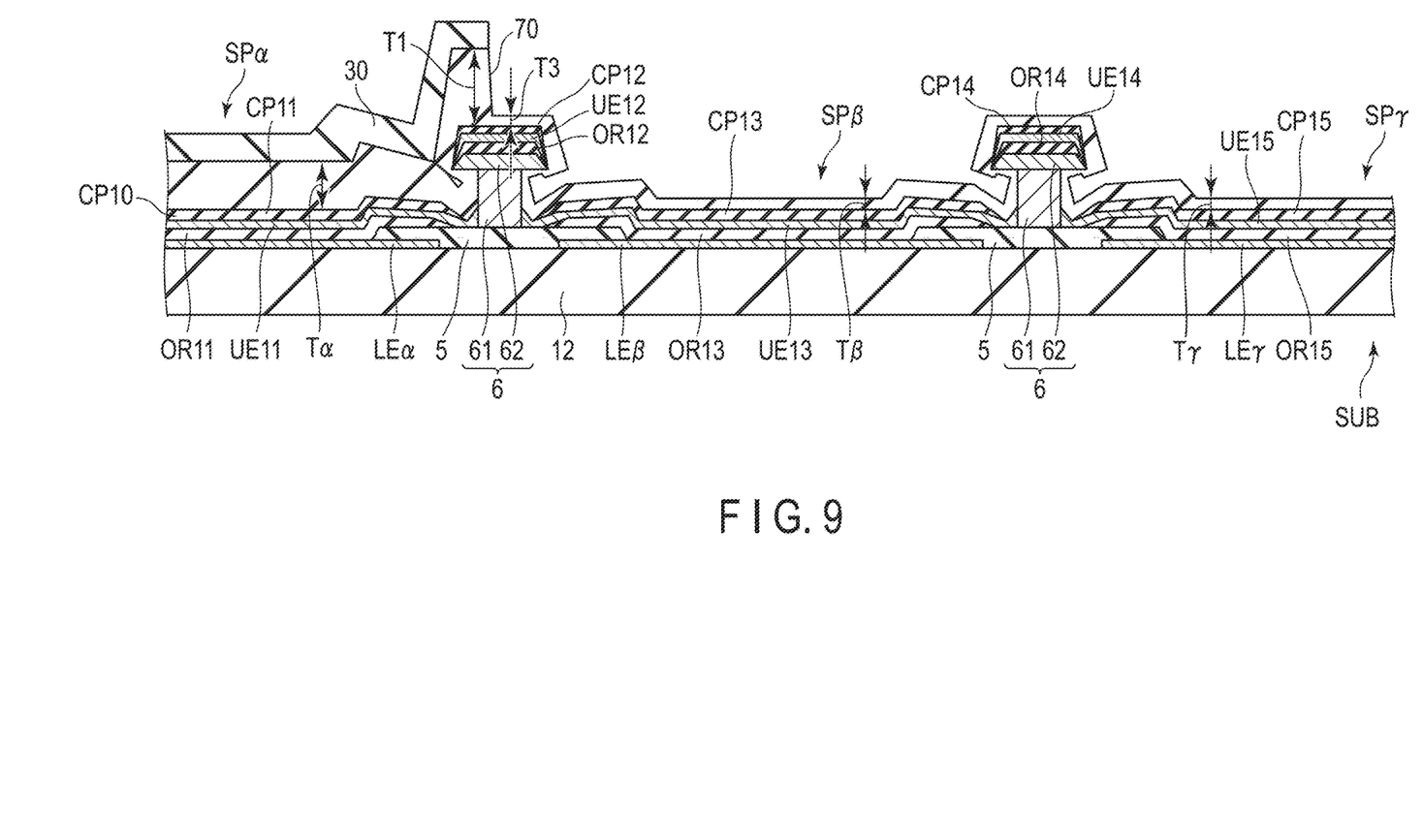
FIG. 9 illustrates a first etching (anisotropic dry etching) of the first thin film.

Then, in step ST23, as shown in FIG. 9, using the resist 30 as a mask, anisotropic dry etching is performed as a first etching of the first thin film to reduce thickness of the sealing layer 70 exposed from the resist 30. In anisotropic dry etching, side etching is less likely to progress compared to isotropic dry etching. Therefore, between the upper portion 62 and the resist 30, side etching of the sealing layer 70 is suppressed and the thickness T1 of the sealing layer 70 is maintained. Note that a thickness T3 of the sealing layer 70 at a portion exposed from the resist 30 directly above the upper portion 62 is smaller than the thickness T1. However, the thickness T3 is greater than 0 μm. The partition 6 between the sub-pixel SPα and the sub-pixel SPβ, the second organic layer OR12, the second upper electrode UE12, and the second cap layer CP12 located above the partition 6 are all covered by the sealing layer 70.

The thickness Tβ, of the sealing layer 70 in the sub-pixel SPβ is smaller than the thickness Tα of the sealing layer 70 in the sub-pixel SPα. Furthermore, in the illustrated example, the thickness Tγ of the sealing layer 70 in the sub-pixel SPγ is also smaller than the thickness Tα. In one example, the thicknesses Tβ, and Tγ are almost equivalent to the thickness T3. Note that the thicknesses Tβ, and Tγ are greater than 0 μm. That is, the sealing layer 70 remains in the sub-pixel SPβ and the sub-pixel SPγ, and the third cap layer CP13 and the fifth cap layer CP15 are covered by the sealing layer 70.

In addition, the partition 6 between the sub-pixel SPβ and the sub-pixel SPγ, the fourth organic layer OR14, the fourth upper electrode UE14, and the fourth cap layer CP14 located above the partition 6 are all covered by the sealing layer 70.

Figure 10:
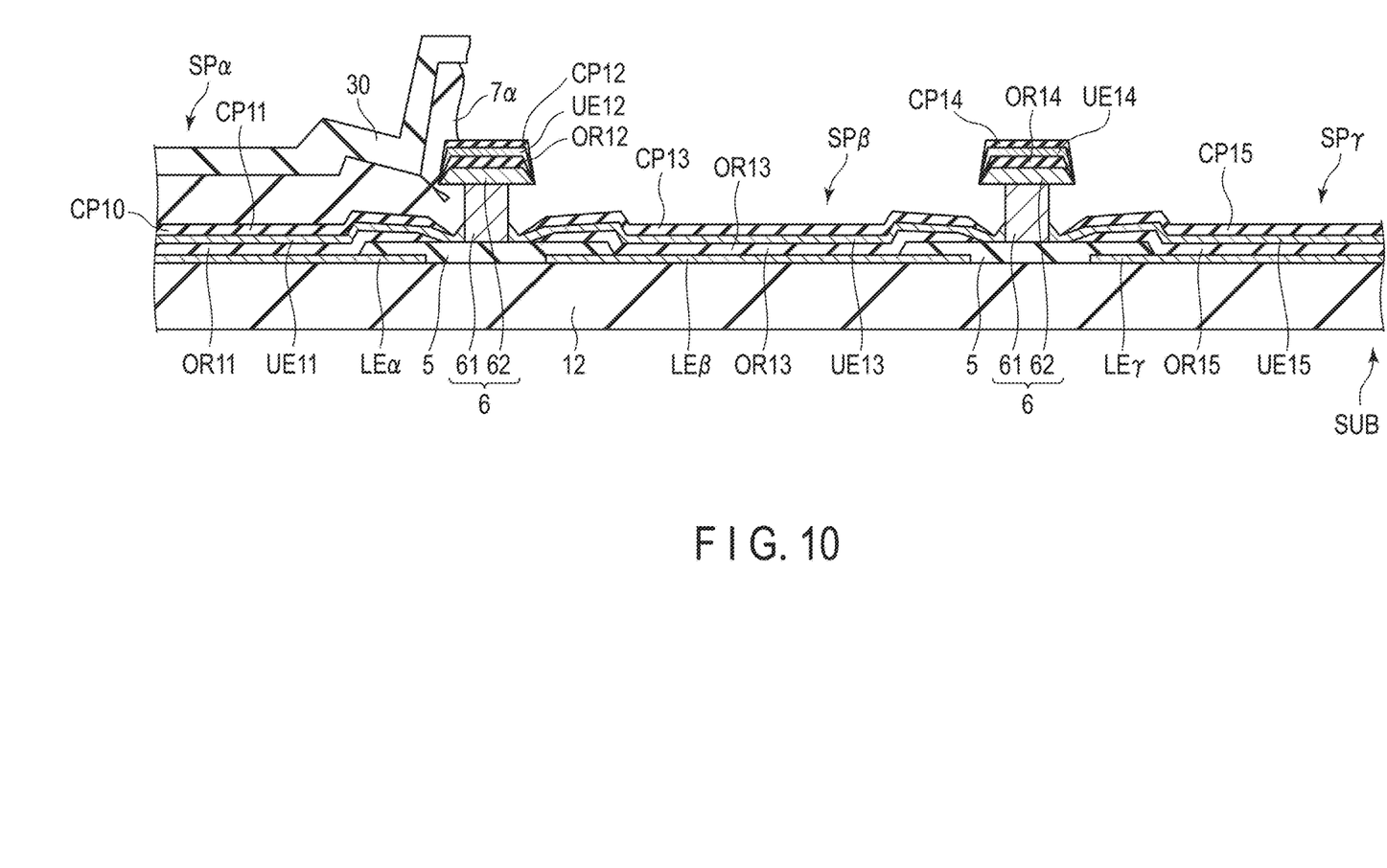
FIG. 10 illustrates a second etching (isotropic dry etching) of the first thin film.

Then, as shown in FIG. 10, using the resist 30 as a mask, isotropic dry etching is performed as a second etching of the first thin film to remove the sealing layer 70 exposed from the resist 30. By this isotropic dry etching, the third cap layer CP13 of sub-pixel SP13 and the fifth cap layer CP15 of the sub-pixel SPγ are exposed from the sealing layer 70. A sealing layer 7α is formed in the sub-pixel SPα.

In addition, regarding the lower portion 61, the upper portion 62, and the second cap layer CP12 between the sub-pixel SPα and the sub-pixel SPβ, the respective sub-pixel SPα sides are covered by the sealing layer 7a while the respective sub-pixel SPβ sides are exposed from the sealing layer. Regarding the lower portion 61, the upper portion 62, and the fourth cap layer CP14 between the sub-pixel SPβ and the sub-pixel SPγ, the respective sub-pixel SPβ sides are exposed from the sealing layer, and the respective sub-pixel SPγ sides are exposed from the sealing layer. Such a cap layer CP10 functions as an etching stopper layer.

The processing conditions for the above anisotropic dry etching and isotropic dry etching are as follows.

Anisotropic dry etching is performed for a predetermined time so that the thickness of the sealing layer 70 is sufficiently reduced. On the other hand, isotropic dry etching is performed until an endpoint is detected. The endpoint can be detected, for example, by monitoring the spectrum of plasma in a chamber.

The processing time for isotropic dry etching is shorter than that for anisotropic dry etching. That is, the amount of sealing layer 70 removed by anisotropic dry etching is greater than the amount of sealing layer 70 removed by isotropic dry etching. In other words, because the processing time for isotropic dry etching is shortened, side etching of the sealing layer 70 is suppressed.

The pressure in the chamber where anisotropic dry etching is performed is smaller than the pressure in the chamber where isotropic dry etching is performed.

The bias power of a stage on which the processing substrate is disposed when performing anisotropic dry etching is greater than the bias power of a stage on which the processing substrate is disposed when performing isotropic dry etching.

The flow rate of fluorine-based gas introduced into the chamber for anisotropic dry etching is less than the flow rate of fluorine-based gas introduced into the chamber for isotropic dry etching. As examples of gas species introduced into the chamber when performing anisotropic dry etching and isotropic dry etching, fluorine-based gases such as sulfur hexafluoride ($SF_6$), methane tetrafluoride ($CF_4$), ethane hexafluoride ($C_2F_6$), methane trifluoride ($CHF_3$), and nitrogen trifluoride ($NF_3$) are applicable.

Thus, the sealing layer 70 of the first thin film is formed to have a predetermined shape by performing anisotropic dry etching followed by isotropic dry etching.

As comparative example 1, when the sealing layer 70 is patterned only by isotropic dry etching, side etching proceeds excessively. Therefore, at the timing when the sealing layer 70 of the sub-pixel not covered by the resist 30 is completely removed, there is a risk that an area near the partition of the sub-pixel covered by the resist 30 may be exposed from the sealing layer 70.

As comparative example 2, when the sealing layer 70 is patterned only by anisotropic dry etching, side etching is unlikely to progress. Therefore, at the timing when the sealing layer 70 in the area near the partition of the sub-pixel covered by the resist 30 is completely removed, there is a risk that the sealing layer 70 may remain in the area near the partition of the sub-pixel not covered by the resist (especially in an area that is in the shadow of the upper portion 62). In a case where a part of the sealing layer 70 remains, further anisotropic dry etching to remove this sealing layer may cause damage to the elements of the sub-pixel exposed from the sealing layer earlier.

According to the present embodiment, the sealing layer 70 of the sub-pixel not covered by resist 30 is removed reliably, and damage to the elements of the sub-pixel exposed from the sealing layer is suppressed. In addition, the sub-pixels covered by the resist 30 are reliably covered by the sealing layer 70, thereby suppressing the formation of an undesirable moisture ingress path. Therefore, reliability can be improved.

Figure 11:
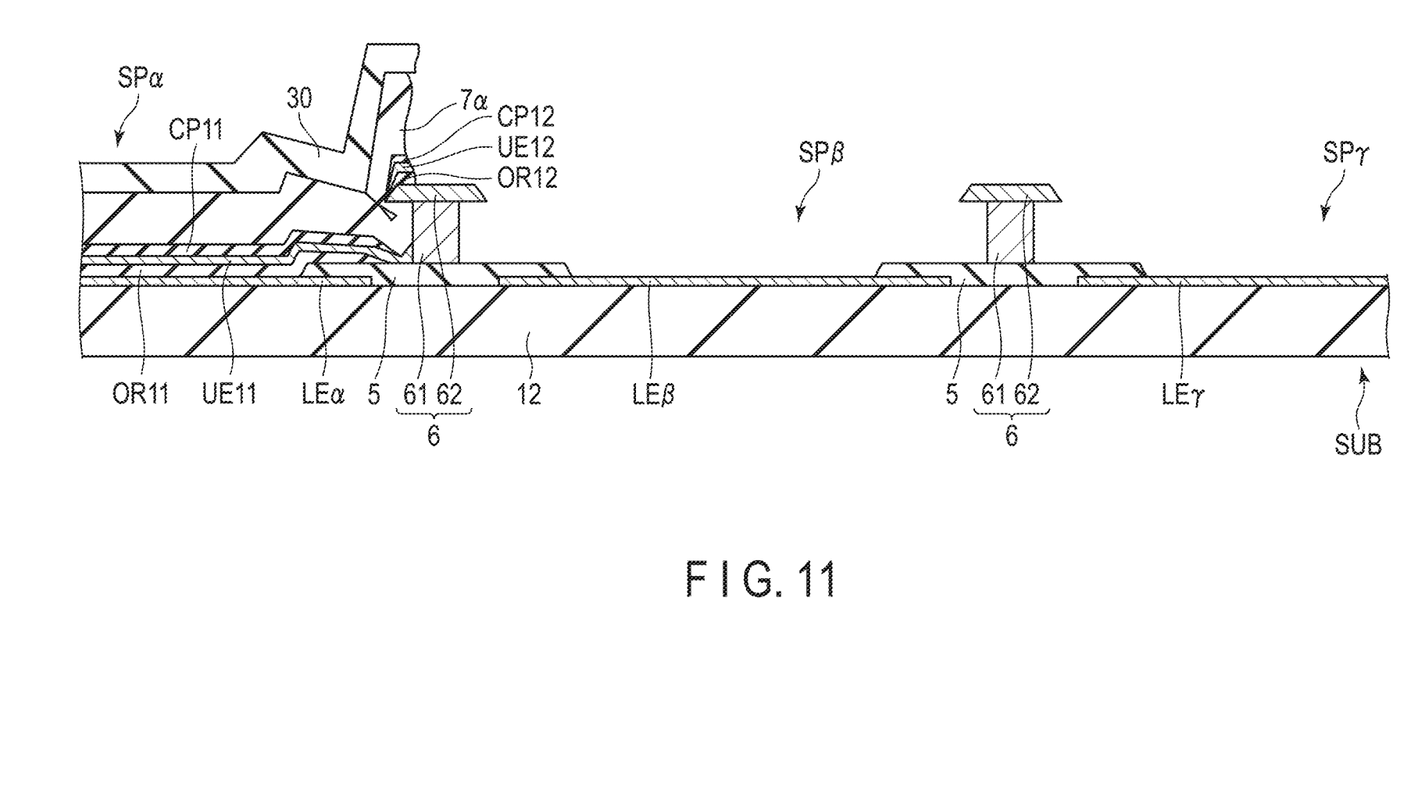
FIG. 11 illustrates a third etching of the first thin film.

Then, as shown in FIG. 11, a third etching of the first thin film is performed using the resist 30 as a mask. In this third etching, a part of the second organic layer OR12, all of the third organic layer OR13, all of the fourth organic layer OR14, all of the fifth organic layer OR15, a part of the second upper electrode UE12, all of the third upper electrode UE13, all of the fourth upper electrode UE14, all of the fifth upper electrode UE15, a part of the second cap layer CP12, all of the third cap layer CP13, all of the fourth cap layer CP14, and all of the fifth cap layer CP15 exposed from the resist 30 are removed. As a result, the lower electrode LEβ is exposed in the sub-pixel SPβ, and the lower electrode LEγ is exposed in the sub-pixel SPγ.

Also, regarding the partition 6 between the sub-pixel SPα and the sub-pixel SPβ, directly above the upper portion 62, the second organic layer OR12, the second upper electrode UE12, and the second cap layer CP12 are formed on the sub-pixel SPα side, and the second organic layer OR12, the second upper electrode UE12, and the second cap layer CP12 are removed on the sub-pixel SPβ side. Therefore, on the sub-pixel SPβ side, the upper portion 62 is exposed.

Also, regarding the rib 5 between the sub-pixel SPα and the sub-pixel SPβ, the sub-pixel SPβ side is exposed.

Also, regarding the partition 6 between the sub-pixel SPβ and the sub-pixel SPγ, the lower portion 61 and the upper portion 62 are exposed.

Also, regarding the rib 5 between the sub-pixel SPβ and the sub-pixel SPγ, the sub-pixel SPβ side and the sub-pixel SPγ side are exposed respectively.

Figure 12:
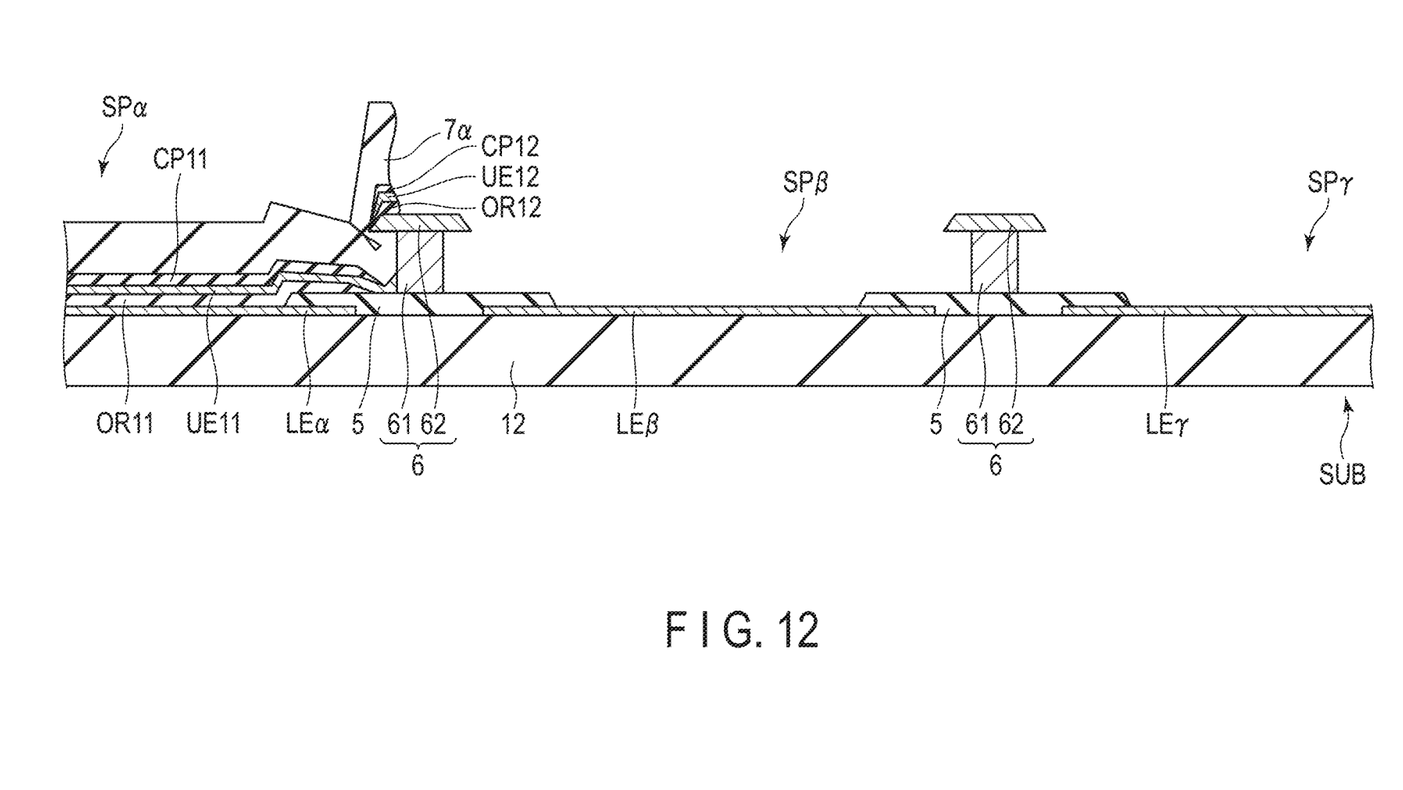
FIG. 12 illustrates a process of removing a resist.

Then, as shown in FIG. 12, in step ST24, the resist 30 is removed. As a result, the sub-pixel SPα is formed.

The sub-pixel SPα is one of the above sub-pixels SP1, SP2, and SP3. For example, in the case where the sub-pixel SPα corresponds to the sub-pixel SP1 above, the lower electrode LEα corresponds to the lower electrode LE1, the first organic layer OR11 corresponds to the first organic layer OR1α, the second organic layer OR12 corresponds to the second organic layer OR1b, the first upper electrode UE11 corresponds to the first upper electrode UE1a, the second upper electrode UE12 corresponds to the second upper electrode UE1b, the first cap layer CP11 corresponds to the first cap layer CP1a, the second cap layer CP12 corresponds to the second cap layer CP1b, and the sealing layer 7α corresponds to the sealing layer 71.

By performing the same process as steps ST21 to ST24 above, the sub-pixel SPβ and the sub-pixel SPγ can be formed. Note that, in the process of forming the sub-pixel SPβ, an organic layer including a second light-emitting layer emitting light of a second color is formed on the processing substrate SUB as an organic layer. In the process of forming the sub-pixel SPγ, an organic layer including a third light-emitting layer emitting light of a third color is formed on the processing substrate SUB as an organic layer. The first, second, and third colors are different from each other.

As explained above, the present embodiment can provide a method of manufacturing a display device that can improve reliability and increase manufacturing yield.

Based on the method of manufacturing a display device, which has been described in the above-described embodiments, a person having ordinary skill in the art may achieve a method of manufacturing a display device with an arbitral design change; however, as long as they fall within the scope and spirit of the present invention, such a manufacturing method is encompassed by the scope of the present invention.

A skilled person would conceive various changes and modifications of the present invention within the scope of the technical concept of the invention, and naturally, such changes and modifications are encompassed by the scope of the present invention. For example, if a skilled person adds/deletes/alters a structural element or design to/from/in the above-described embodiments, or adds/deletes/alters a step or a condition to/from/in the above-described embodiment, as long as they fall within the scope and spirit of the present invention, such addition, deletion, and altercation are encompassed by the scope of the present invention.

Furthermore, regarding the present embodiments, any advantage and effect those will be obvious from the description of the specification or arbitrarily conceived by a skilled person are naturally considered achievable by the present invention.

What is claimed is:

1. A method of manufacturing a display device, comprising:
   preparing a processing substrate in which a lower electrode, a rib having an aperture overlapping the lower electrode, and a partition including a lower portion disposed on the rib and an upper portion disposed on the lower portion and protruding from a side surface of the lower portion are formed above a substrate;
   forming a first organic layer covering the lower electrode and a second organic layer spaced apart from the first organic layer and located on the upper portion;
   forming a first upper electrode covering the first organic layer and in contact with the lower portion, and a second upper electrode spaced apart from the first upper electrode and located on the second organic layer;
   forming a sealing layer located on the first upper electrode and the second upper electrode;
   forming a resist covering a part of the sealing layer;
   performing anisotropic dry etching using the resist as a mask to reduce thickness of the sealing layer exposed from the resist; and performing isotropic dry etching using the resist as a mask to remove the sealing layer exposed from the resist.

2. The method of manufacturing a display device of claim 1, wherein before the anisotropic dry etching is performed, the thickness of the sealing layer between the upper portion and the resist is greater than a thickness of the lower portion.

3. The method of manufacturing a display device of claim 1, wherein before the anisotropic dry etching is performed, a width of the resist directly above the upper portion is greater than a width of the upper portion protruding from the side surface and smaller than a total width of the upper portion.

4. The method of manufacturing a display device of claim 3, wherein the width of the resist is 1 μm or more.

5. The method of manufacturing a display device of claim 1, wherein the anisotropic dry etching is performed for a predetermined time, and
the isotropic dry etching is performed until an endpoint is detected.

6. The method of manufacturing a display device of claim 5, wherein an isotropic dry etching process time is shorter than an anisotropic dry etching process time.

7. The method of manufacturing a display device of claim 1, wherein pressure in a chamber in which the anisotropic dry etching is performed is smaller than pressure in a chamber in which the isotropic dry etching is performed.

8. The method of manufacturing a display device of claim 1, wherein bias power of a stage in which the processing substrate is disposed when performing the anisotropic dry etching is greater than bias power of a stage in which the processing substrate is disposed when performing the isotropic dry etching.

9. The method of manufacturing a display device of claim 1, wherein a flow rate of fluorine-based gas introduced into the chamber for performing the anisotropic dry etching is smaller than a flow rate of fluorine-based gas introduced into the chamber for performing the isotropic dry etching.

10. The method of manufacturing a display device of claim 1, further comprising, prior to forming the sealing layer, forming a first cap layer located on the first upper electrode and a second cap layer spaced apart from the first cap layer and located on the second upper electrode.

11. The method of manufacturing a display device of claim 10, further comprising, after removing the sealing layer, performing etching using the resist as a mask to remove a part of the second cap layer, a part of the second upper electrode, and a part of the second organic layer.

* * * * *